US006492095B2

(12) United States Patent
Samworth

(10) Patent No.: US 6,492,095 B2
(45) Date of Patent: Dec. 10, 2002

(54) SCREENED FILM INTERMEDIATE FOR USE WITH FLEXOGRAPHIC PRINTING PLATE HAVING IMPROVED SOLIDS RENDITION

(75) Inventor: Mark Samworth, Wilmington, DE (US)

(73) Assignee: PCC Artwork Systems, Bristol, PA (US)

( * ) Notice: Subject to any disclaimer, the term of this patent is extended or adjusted under 35 U.S.C. 154(b) by 0 days.

(21) Appl. No.: 09/828,385

(22) Filed: Apr. 6, 2001

(65) Prior Publication Data

US 2001/0029859 A1 Oct. 18, 2001

Related U.S. Application Data

(62) Division of application No. 09/312,188, filed on May 14, 1999, now Pat. No. 6,213,018.

(51) Int. Cl.[7] .................................................. G03F 7/12

(52) U.S. Cl. .................. 430/306; 101/348; 101/352.13; 101/395; 101/401; 101/401.1; 358/1.9; 358/456; 358/458; 358/459; 358/455

(58) Field of Search .......................... 430/306; 101/348, 101/352.13, 395, 401, 401.1, 401.3; 358/456, 1.9, 3.06, 458, 455, 459

(56) References Cited

U.S. PATENT DOCUMENTS

| | | | | |
|---|---|---|---|---|
| 3,613,578 A | | 10/1971 | Heurich | 101/352.13 |
| 3,891,443 A | | 6/1975 | Halpern et al. | 101/395 |
| 3,916,096 A | | 10/1975 | Everett et al. | 178/6.6 R |
| 4,152,986 A | | 5/1979 | Dadowski et al. | 101/463 |
| 4,283,484 A | | 8/1981 | Fairhead et al. | 101/401.1 |
| 4,554,594 A | | 11/1985 | Ciardiello et al. | 358/283 |
| 4,595,956 A | | 6/1986 | Kawamura et al. | 358/283 |
| 4,819,558 A | | 4/1989 | Counard | 101/348 |
| 5,016,191 A | | 5/1991 | Radochonski et al. | 364/518 |
| 5,111,194 A | | 5/1992 | Oneda | 340/793 |
| 5,435,247 A | | 7/1995 | Giori et al. | 101/401 |
| 5,659,385 A | | 8/1997 | Koltz | 355/77 |
| 5,884,560 A | | 3/1999 | Optiz et al. | 101/401 |
| 5,892,588 A | * | 4/1999 | Samworth | 358/298 |
| 6,118,935 A | * | 9/2000 | Samworth | 395/109 |
| 6,355,395 B1 | * | 3/2002 | Zwez et al. | 430/271.1 |

OTHER PUBLICATIONS

"Flexography Principles and Practices" 4th Ed. Foundation of Flexographic Technical Association, Ronkonkama, N.Y., 1992. pp. 130–137.

* cited by examiner

*Primary Examiner*—Janet Baxter
*Assistant Examiner*—Barbara Gilliam
(74) *Attorney, Agent, or Firm*—RatnerPrestia

(57) ABSTRACT flexographic printing plate having solid image areas which are covered by a plurality of very small and shallow cells similar to the ink carrying cells found in anilox ink metering rolls. These cells fill with ink during the plate inking step and reproduce solid image areas with better color saturation while at the same time reducing the halo typical of flexographic printing of solids. Associated with this plate is a method for producing the cells, including the use of an intermediate screened film and of a computer program for generating the film intermediate.

11 Claims, 2 Drawing Sheets

SCREENED FILM INTERMEDIATE FOR USE WITH FLEXOGRAPHIC PRINTING PLATE HAVING IMPROVED SOLIDS RENDITION

This application is a divisional of U.S. patent application Ser. No. 09/312,188, filed on May 14, 1999, U.S. Pat. No. 6,213,018 which has been allowed on Dec. 01, 2000.

BACKGROUND OF THE INVENTION

1. Field of the Invention

This invention relates to flexographic printing and more particularly to a flexographic printing plate having a plurality of ink carrying cells in the solids areas, and the method for making such plates.

2. Description of Related Art

Flexography is a direct rotary printing method that uses resilient relief image plates of rubber or other resilient materials including photopolymers to print an image on diverse types of materials that are typically difficult to image with traditional offset or gravure processes, such as cardboard, plastic films and virtually any type of substrate whether absorbent or non absorbent. As such it has found great applications and market potential in the packaging industry.

Flexographic printing plates are normally affixed onto a printing cylinder for printing. As shown in FIG. 1 an ink fountain pan 10 supplies ink to a metering roll 14. An optional doctor blade 12 may be used to wipe off excess ink from the metering roll to assist in controlling the amount of ink that is on the metering roll. The flexographic printing plates 16 are mounted on the printing cylinder 18. The material to be printed, usually supplied as a continuous web 19, is placed between the printing roll 18 and a backing roll 20. The flexographic printing plate is brought against the material typically with just sufficient pressure to allow contact between the relief image on the plate and the material printed.

Flexograhic printing plates can be made of either vulcanized rubber or a variety of radiation sensitive polymer resins, typically sensitive to ultraviolet radiation. A well known such flexographic photosensitive polymer resin plate is CYREL®, a product of E.I. DuPont de Nemours and Co. Inc. which was introduced in the mid seventies and has since found widespread acceptance by the printing industry.

Flexography printing is a printing process whereby ink is transferred through a metering roll to the relief portions of the printing plate and therefrom in a process akin to stamping from the relief plate areas to the printed surface. In order to produce good images it is essential that the ink applied to the printed surface is applied uniformly and predictably. This in turn requires that the relief areas in the flexographic plate carry ink in a uniform layer and in predictable amounts.

The prior art has attempted to solve this problem by using a special ink metering roll which is know as an anilox roll. Anilox rolls have on their surface a plurality of ink metering cells. These cells are small indentations arrayed in regular patterns of a predetermined frequency and of uniform depth and shape. Typically they are created by engraving the cylinder face by a mechanical process or by laser. The amount of ink delivered by the anilox roll is controlled by the screen size of the cells.

In operation ink is transferred from the ink well onto the anilox metering roll 14 filling the cells. The optional wipe blade 12 wipes off excess ink from the roll surface leaving only the cells filled. The ink from the cells is then transferred onto the flexographic plate relief areas as the anilox roll and the flexographic plate rotate in contact with one another.

Flexographic printing is what may be termed as a binary system. That is it either prints or it does not. Whenever relief areas contact the printed surface, one gets a substantially solid color area. To create a gray scale, a process called half-toning is used. This is a well known process wherein gray tones are reproduced by printing a plurality of minute solid dots per unit area and varying either the frequency of the dots per unit area or the size of the dots per unit area or both.

It has been observed, and is a well known problem in flexographic printing that solid areas, that is areas in the image where there are no half tone dots, appear to print with less saturation and somewhat less uniformity than halftone areas representing dark image areas. Thus an area with a dot coverage of 95% to 98% appears darker than a solid area (100%). Furthermore, solid flexographic image areas tend to show a “halo” around the solid area, that is, a darker border around the solid image area.

As mentioned earlier, flexography's primary application is packaging. Due to product competition, the market requirements on the printing quality of the images on the packaging are becoming very stringent. There is thus a need for flexographic printing plates that alleviate these problems and deliver a better quality image.

SUMMARY OF THE INVENTION

This invention attempts to alleviate the above problems through a flexographic printing plate having a plurality of ink carrying cells on its solid relief printing areas. This plurality of ink carrying cells is arrayed in a regular pattern along rows and columns, and typically the rows form a 90° angle with said columns.

Because the flexographic plates are used with anilox rolls for inking and because the anilox rolls also have ink carrying cells on their surface, it is also an object of this invention to provide flexographic printing plates in which the rows and columns of the flexographic plate ink carrying cells form an acute angle with the rows and columns of the cells of the anilox roll cell array respectively, preferably an angle of between 15 and 45 degrees. Ideally this angle is 30 degrees.

Still according with this invention, there is provided a method of forming a flexographic printing plate by first identifying relief areas of the plate representing solid image areas and then by creating either by laser exposure or etching or any other convenient means an array of a plurality of shallow ink carrying cells on the surface of the relief areas identified as representing solid image areas.

It is a further object of this invention to provide an imaged screened film intermediate representing an image having solid image areas for use in preparing a flexographic printing plate wherein the solid image areas reproduced on said screened film intermediate comprise a dot pattern formed by an array of a plurality of distinct dots arrayed along preselected directions.

To achieve the above objectives it is a further object of this invention to provide a machine readable program for use in a computer to control an imagesetter to produce a screened film for use in making a flexographic printing plate said program performing the steps of:

(a) storing imaging information representing an image including a solid area;

(b) supplying said imaging information to an imagesetter adapted to expose photosensitive film;

(c) supplying information to said imagesetter for exposing said film to produce an imaged screened film intermediate having areas representing said image solid areas wherein the solid image areas reproduced on said screened film intermediate comprise a dot pattern formed by an array of a plurality of distinct dots arrayed along preselected directions.

BRIEF DESCRIPTION OF THE DRAWINGS

The invention can be more fully understood from the following description thereof in connection with the accompanying drawings described as follows.

DESCRIPTION OF THE PREFERRED EMBODIMENT(S)

Figure 2:
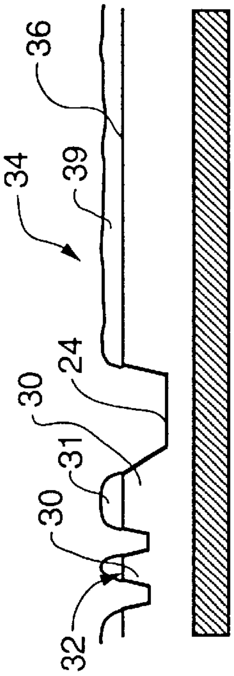
Fig. 2 PRIOR ART
FIG. 2 shows a schematic elevation cross section of an inked flexographic printing plate solid image area according to the prior art.

Throughout the following detailed description, similar reference characters refer to similar elements in all figures of the drawings. Such figures as included herein are for illustration of particular aspects of the invention and therefore are not drawn to scale.

The preparation of a flexographic printing plate is well known technology, and is described, inter alia, in a certain publication entitled "Flexography, principles and practices", $4^{th}$ edition, 1991 published by the Flexographic Technical Association Inc. Because of the popularity of photosensitive flexographic printing plates, we will often refer to such plates in the description of the present invention, with the understanding that such reference is only for the purpose of describing typical embodiments rather than to limit this invention to photopolymerizable flexographic printing plates.

In a preferred embodiment of the present invention, a flexographic plate is prepared substantially as described in pages 130 through 134 of the aforementioned publication, "Flexography, principles and practices".

The images typically reproduced by today's flexographic plates almost always include both solid image areas and a variety of gray tone areas. By solid areas we mean areas completely covered by ink having the highest density the ink can produce on a given material. By gray areas we mean image areas where the appearance of the printed image is of a density intermediate to pure white (total absence of ink) and solid. Gray areas are produced by the aforementioned well known process of half-toning, wherein a plurality of relief surface areas per unit area of progressively larger surface area are used to produce the illusion of different density printing. These relief areas are commonly referred to in the printing industry as "dots" and are produced in regular repeating patterns of X-number of dots per linear inch. These patterns are identified by the percentage coverage of a given area by the dot surface area within the given area as 1% dots, 5% dots 95% dots 98% dots etc. A 98% dot means that 98% of a given area is occupied by the dot surface size. A 2% dot means that 2% of the same given area is occupied by the dot surface area therein.

In an alternate embodiment rather than changing the dot size, the dot size is held constant and the frequency of occurrence of the dots is increased to produce higher and higher surface area coverage. Finally, as described in my U.S. Pat. No. 5,892,588, a combination of the two techniques may be used to improve the visual appearance of the printed image.

In a flexographic plate, as shown in FIG. 2, these dots 30 are relief areas having their surface 32 at the top surface of the plate. The plate in the area surrounding the dot 30 has been etched to a depth which except for the darkest areas reaches to a floor 24. The height of the dot is the distance of the surface of the dot (and plate surface as well) to the floor. We will refer to this dot height as the halftone relief. This relief decreases as the % dot coverage increases. However this relief is sufficient to confine ink 31 to the dot surface.

Halftone relief is controlled by a number of factors, including the etching process used to remove the material from between the dots. In a photopolymer flexographic printing plate the maximum relief is controlled by a back exposure of the plate which hardens the photopolymer to a given depth and establishes an absolute floor and thus a maximum relief.

Whether the plate is a photopolymerizable plate or an etchable plate, the halftone pattern a is produced using a mask which in the photopolymerizable plate case comprises a sheet of exposed and developed photographic film. We will refer to this mask as the screened film, intermediate. The screened film intermediate has a negative pattern of the dots that are to be reproduced on the plate, and in essence comprises a plurality of darkened areas representing the spacing between the dots, and a plurality of transparent areas representing the dots. This screen is placed on the plate and light is shone through the screen to expose-the plate. Exposure hardens the plate in the transparent screen areas and after processing the unexposed areas are washed off leaving the relief dots behind.

As the percentage area coverage increases, the dots eventually contact and blend with each other so that after a 50% coverage is reached one no longer has isolated relief areas per dot, but isolated holes separating the dots, extending from the surface of the plate toward the floor.

As the dot coverage increases these holes become smaller and smaller and progressively less deep. The relief of the dot (or the depth of the hole) is dependent on the dot separation (or the diameter of the hole). Upper limits of flexographic printing plates are 98% dot coverage before plugging of the holes occurs, with 95% being a more realistic figure. This effect is used in the present invention to create a plurality of shallow ink carrying cells in the surface of solid areas in a flexographic plate to improve printing of solids.

It was stated earlier that a problem in printing solids in flexography was uneven ink transfer over the full solid area, lack of density and a halo effect along the edges of the solid area. The present invention alleviates these problems by improving the ink carrying ability of the solid areas of the flexographic printing plates by providing in that surface a plurality of ink carrying cells as shown in FIG. 3.

Figure 3:
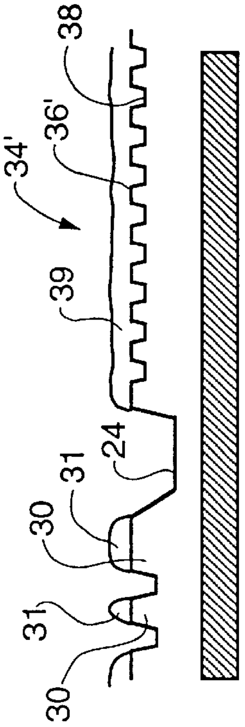
FIG. 3 shows a schematic elevation cross section of an inked flexographic printing plate solid image area according to this invention.

When one compares the solid area 36 of a flexographic plate 34 as shown in FIG. 2 with the same area shown in FIG. 3 one sees that the surface 36' of the plate 34' in FIG. 3 is no longer smooth but it is dotted with a plurality of ink carrying cells 38. These cells do not extend to the floor 24 but are rather shallow in depth and are arrayed in a much higher frequency pattern than the halftone dots. For example the halftone dot pattern in flexographic plates is of the order of a 100 to 150 dots per inch (or lines per inch, lines per inch being a term often used in the industry) while the ink carrying cells are arrayed at frequencies of 500 to 1000 dots (or lines) per inch. Such cell frequencies are similar to the cell frequencies of the ink carrying cells found in the anilox cylinders (which also typically vary between 500 and 500 lines per inch) and serve the same purpose as the anilox cylinders, that is to carry ink. Ink from the anilox cylinder is picked up by the flexographic plate and fills the cells as well as bridges over the cells on the solid areas. The cells appear to behave as anchor points for the ink film 39 creating an even ink distribution over the solid surface area and substantially eliminating ink accumulation or beading, usually observed along the solid image area edge. Printing of solids is thus very uniform and has good saturation and density, exceeding the saturation and density obtained by the traditional smooth solid printing surface used heretofore.

Figure 5:
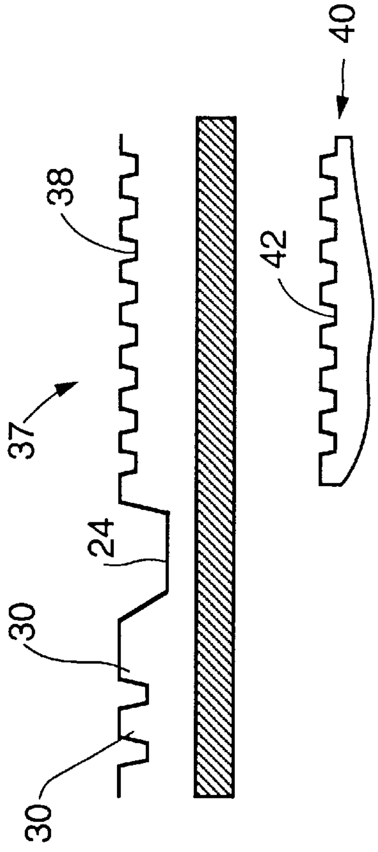
FIG. 5 shows a side by side cross section comparison of an anilox roll and a solid area of a flexographic plate.

There are a number of design parameters that must be observed if one is to obtain the best results with this invention. It is important that the plate cell ink carrying capacity per unit area be at most equal to or, preferably less than the ink carrying capacity of the anilox cylinder. If this is not observed, there may be insufficient ink transferred to the printing plate and therefrom to the printed surface, resulting in less than perfect solid density in the printed surface. To prevent such “ink starving” problem, the plate 37 cells 38 as shown in FIG. 5 are smaller (i.e. have less depth, or may have a smaller diameter) than the anilox metering roll 40 cells 42

Figure 6:
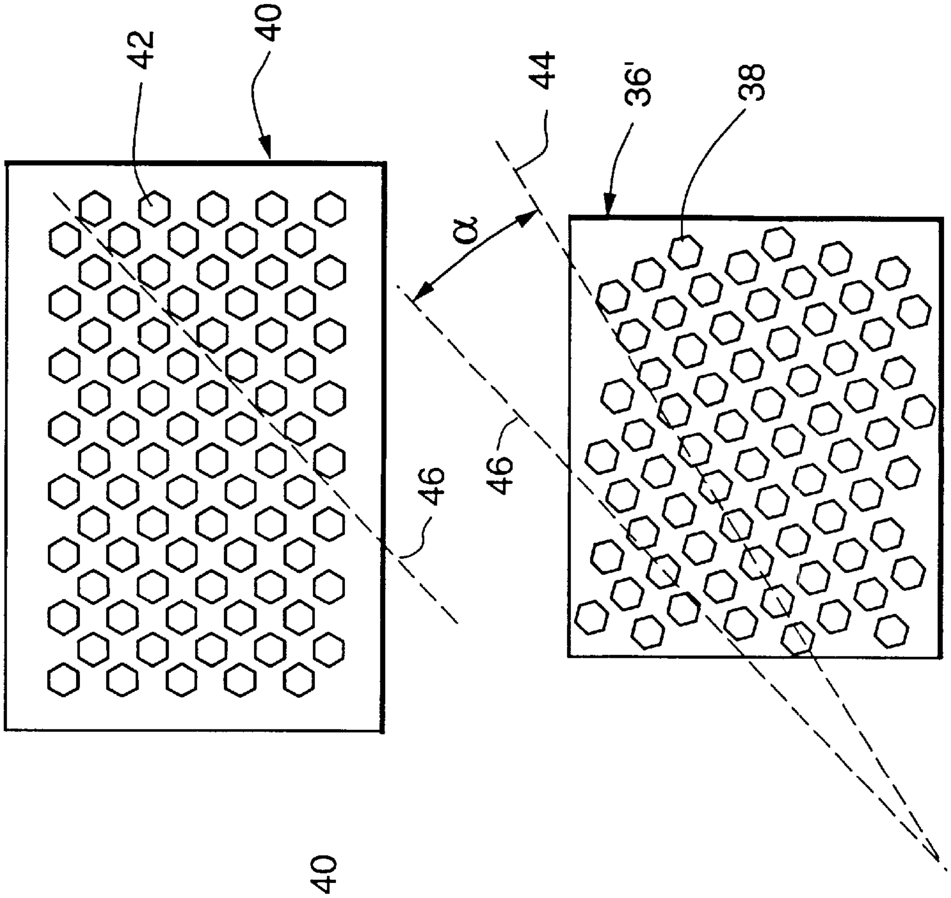
FIG. 6 shows a top view of a side by side comparison of an anilox roll surface and a flexographic printing plate and the relative orientation of the rows and columns in each.

The second important point is the nature of the distribution of the ink carrying cells. The cells in both the anilox rolls and the plate are preferably arrayed in rows and columns. In order to avoid formation of Moiré patterns from the superposition of the anilox roll cell pattern onto the plate cell pattern, it is preferred that the plate cell rows and columns form an acute angle between the anilox rows and columns respectively, as shown in FIG. 6. As shown in FIG. 6, the ink carrying cells 38 of the solid surface area 36' are arrayed in rows along a first orientation, indicated by dotted line 44. This orientation forms an angle a with the rows of the cells 42 on the anilox roll 40 which are arrayed along a second orientation, indicated by dotted line 46.

It has been the printing industry experience that an acute angle $\alpha$ between 15 and 45 degrees is optimum for avoiding Moire interference patterns when using superposed halftone images with anilox rolls or with other halftone images (as in the case of multicolor printing). It has been our observation that the same principles in selecting this angle a also apply to the present invention if one is to avoid offensive artifacts in the printed image.

Therefore, in laying out the cell pattern on the plate solid areas, the relative orientation of the plate to the anilox roll must be considered and the plate pattern of cells arranged such that the plate cells columns and rows are arrayed at an angle between 15 and 45 degrees relative to the anilox roll cells rows and columns respectively. A preferred value for this angle $\alpha$ is 30 degrees.

In addition, if four color printing is the end result, this relationship must preferably be maintained to the extent possible in all four color separation plates and all four anilox rolls, as well as between all four color separation plates alone.

Figure 7:
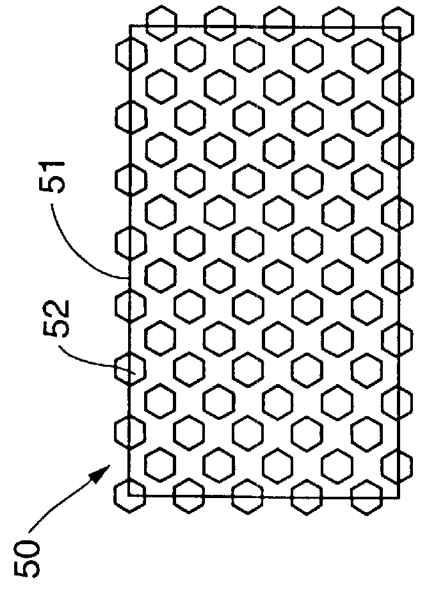
FIG. 7 shows an ink cell distribution on a solid surface that results in a problem identified as scalloped edges.

FIG. 7 illustrates a possible problem when using the present invention. Assuming that the solid image area 50 in which the ink carrying cells will be placed has a surrounding edge 51 and that a given pattern of ink cells will be created covering the area within the edge 51, it is likely that a number of ink carrying cells 52 will fall on the edge, and will thus be incomplete cells. The result is that the printed solid area edges have a scalloped appearance, typical of gravure printing.

Figure 4:
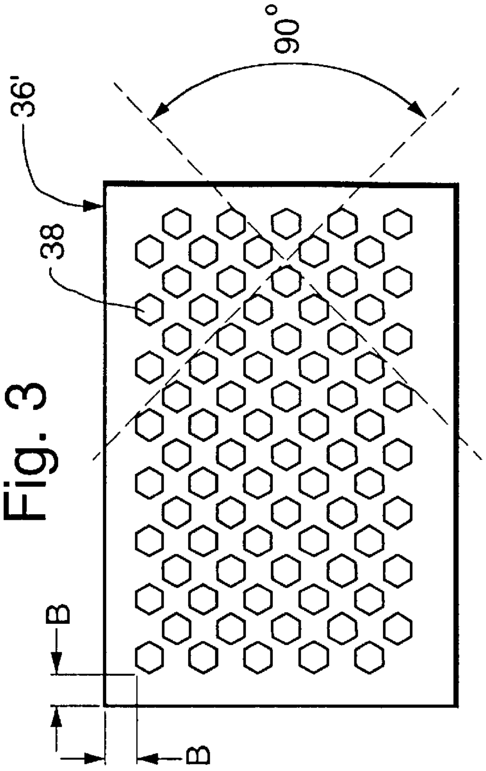
FIG. 4 shows a top view of an enlarged portion of the solid image area of the flexographic printing plate of FIG. 3.
Figure 1:
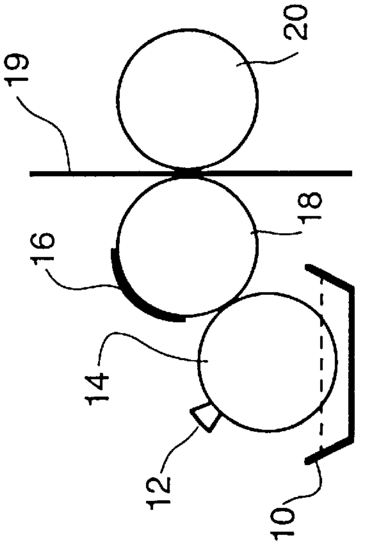
FIG. 1 shows a schematic elevation of the various basic elements of a single color flexographic printing press.

This scalloped appearance may be eliminated by setting a predetermined distance “B” from such edge within which no cells are created, as shown in FIG. 4. Such distance is preferably of the order of 20 to 100 microns.

To produce a flexographic printing plate according to the present invention, one preferably begins with the creation of a screened film intermediate of the images to be printed. When multiple color printing is involved there will be usually four such film intermediates each representing a color separation as is well known in the art.

These film intermediates may be produced by traditional photographic methods or as is more likely today by a computer controlled film exposure device such as an imagesetter (laser printer) and an associated properly programmed computer.

The computer may be programmed through appropriate software to generate a halftone film negative in a manner disclosed in my aforementioned U.S. Pat. No. 5,892,588 or in any of the traditional half-toning processes well known in the art. The computer controls the laser printer and creates the half-tone dots by exposing or not exposing individual picture elements or pixels. A combination of a plurality of pixels is used to form dots of different areas. Again this is well known technology and is shown, inter alia, both in the aforementioned U.S. Pat. No. 5,892,588 patent and in numerous other publications including U.S. Pat. No. 3,916,096, Everett et al. and U.S. Pat. No. 5,016,191, Radochonski.

Regardless of the screening process selected for the halftone process for a particular image, be it stochastic or conventional line screening, in accordance with this invention a required step is the identification of the solid areas in an image, and the solid image area edge coordinates. This information is stored and used to control the exposure device to produce the dot pattern required to create the ink carrying cells.

Using this information, the exposing laser beam of the imagesetter scans the identified solid areas of the film at a rate and at a pixel size sufficient to produce cells at a line frequency of between 500 and 500 cells per inch. Typically this is done using a laser beam focussed to a pixel size of a few microns, i.e. 7 to 14 microns. A number of these pixels are combined to form a dot.

Figure 8:
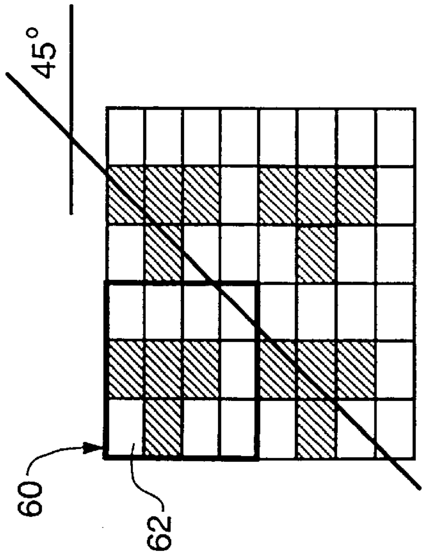
FIG. 8 shows a preferred computer generated plate ink carrying cell top view produced using a plurality of pixels.

FIG. 8 shows a portion of a screened film intermediate solid image area prepared according to this invention. A tile size is first calculated. A tile 60 consists of a predetermined number of pixels 62 arrayed in two dimensions along the scanning path of the laser beam. These tiles are repeated side by side to cover the full solid area. FIG. 8 shows four such tiles.

The dot that will be used to eventually generate the ink cell represents a darkened area within one such tile. In FIG.

8 each tile consists of nine pixels. In calculating which of the nine pixels will be exposed by the laser beam to produce a proper dot on the film intermediate, the following requirements must be satisfied. (1) The dots must generate cells having a dimension such that their ink carrying capacity is less than the ink carrying capacity of the anilox roll cells. (2) The individual ink cells generated must not touch, or in other words there must always be plate surface area (land) between each cell and its adjacent cells. Therefore the dots on the intermediate film must also not touch, i.e. they must be distinct. (3) The cells must be arrayed along a particular frequency and at an angle depending on the anilox cell array. Therefore, the dots must also, preferably, be arrayed and the dot array orientation must be correlated with the anilox cell array orientation. (4) Finally,. the resulting cell shape must resemble as much as possible a circle, and therefore the dot shape must also be chosen to resemble a circle. This last requirement is of lesser significance than the previous three.

The above conditions have been satisfied in FIG. 8 where each dot consists of nine pixels only four of which are darkened. Such arrangement provides an array that forms a 45° angle with the plate edge, and which, assuming the plate edge is parallel with the plate cylinder axis makes a 45° angle with the anilox cylinder axis. This plate cell angle would be acceptable if the anilox cell array angle makes a 15° angle with its axis as it results in a 30° angle between the plate cell array and the anilox cell array. While not shown in the figure, when a 10 micron pixel is used, the dot frequency is of the order of about 700 to 800 dots/inch. It is preferred that the screened film intermediate dot frequency be equal to or less than the ink cell frequency of the anilox roll that will be used with the plates produced using such intermediate film.

If the laser focus is 10 microns, each pixel is also 10 microns, and the resulting cell size on the plate may be estimated. The maximum diameter of the darkened dots in the screen film made using the pattern of FIG. 8 is about 30 microns. Using the rule of thumb that the depth of a hole resulting from exposing a photopolymer plate through a mask results in a hole depth ½ the maximum diameter of the dot, the resulting cell depth is about 15 microns. Thus, the dot size to be used in the intermediate film can be computed so that the resulting cells in the plate hold less ink than the anilox roll cells. The use of computer computational power permits using algorithms involving reasonably accurate approximations of the cell volume, and may be used to calculate intermediate dot shapes and sizes. The simplest approximation is of course a conical cavity having a base diameter equal to the dot max. diameter and a depth equal to ½ the diameter. In an alternate embodiment experimentation may be used to determine optimum dot shape, size and frequency for use with a particular metering roll and plate material.

The film intermediate contains markings for proper orientation and positioning of the film on the plate. These markings allow one to determine the solid image orientation relative to the printing cylinder. This, in turn, permits the array of tiled dots to be created at a particular angular orientation relative to the axis of the cylinder on which the plate is eventually mounted as mentioned above. Because the printing cylinder axis and the anilox roll axis are parallel and the relative orientation of the anilox roll cells to the anilox roll axis is known, it is possible to orient the plate ink cell array so that the required angle between the plate cell array and the anilox cell array is obtained.

Preferably no dots are created to within one or two pixels from a solid image area edge to alleviate the scalloped edge problem discussed above.

The screened film intermediate is next placed on a photopolymerizable plate such as a Cyrel® photosensitive polymer printing plate and the plate is exposed through the film to U.V. radiation. The polymer material under the film dots representing the cells remains unpolymerized to a depth which is approximately ½ of the dot maximum width.

Following exposure the plate is processed in a developer which washes off the unpolymerized areas in the plate. As a result when processing is finished the plate surface bears in the image areas a plurality of shallow ink carrying cells having a typical depth of about 15 microns. During this operation, halftone dots in any halftone image areas are. processed to a depth which ideally approaches the plate floor. The dot relief in every case is enough so that upon inking of the plate with the anilox roll, only the top surface area of the dot retains ink 31, in the traditional half-tone flexographic printing process, as shown in FIGS. 2 and 3.

The plates thus formed are aligned and mounted on the printing cylinder and the cylinder is mounted on the press. Printing proceeds in the usual manner.

Solid areas in printed images that were printed with plates produced according to this invention exhibit higher density and better uniformity in the solid area color and a reduction in halo around the edges of solids, than plates printed with the traditional smooth solid area surface.

The previous description refers to a process for making a photopolymerizable plate using a screened film half-tone negative. Such negatives may also be used with a non photopolymer plate, through the use of an intermediate photomask over an etchable plate as is well known in the art. In certain applications rather than making a separate screened film, a photosensitive coating is placed directly on the plate as a top layer. This layer may then be imaged in the same manner as the screened film and subsequently used as the mask for exposing and processing the flexographic plate.

The advent of computers and their wide acceptance in the printing industry, make it likely that the above process will be implemented with a software program that will control a computer. The computer thus programmed will then control a typesetter to produce a film screen intermediate. Such computer program should as a minimum be able to:

(A) Store and/or retrieve imaging information representing an image including a solid area in a memory.

(B) Supply this imaging information to an imagesetter adapted to expose photosensitive material.

(C) Also supply information to the imagesetter for exposing a photosensitive material such as photographic film to produce an imaged screened film intermediate having areas representing the solid image areas. The solid image areas reproduced include a dot pattern comprising a plurality of pixels. The dot pattern may form an array of a plurality of distinct dots arrayed along preselected directions.

Preferably, the program should also be capable of:

(i) Obtaining the orientation of a an array of ink carrying cells on an ink metering roll, such as an anilox roll.

(ii) Computing the position of the solid image area when the flexographic plate using the screened film intermediate is placed in a position for applying ink thereon through the metering roll; and (iii) calculating the orientation of the array of the plurality of distinct dots on the solid image areas on the screened film intermediate so that it forms on the printing plate an array of ink carrying cells on the solid image area oriented at an acute angle relative to the metering roll ink carrying cell array, when the intermediate film is used to produce the plate.

Furthermore, the use of a screened film intermediate may be eliminated by the creation of such an intermediate as a virtual intermediate in a computer using appropriate software. This software may then be used to control directly either a laser platemaker or a mechanical engraving device.

These modifications are to be construed as being encompassed within the scope of the present invention as set forth in the appended claims wherein I claim:

1. An imaged screened film intermediate representing an image having solid image areas and halftone image areas, said film intermediate for use in preparing a flexographic printing plate, wherein the solid image areas are reproduced on said screened film intermediate comprising an ink cell dot pattern formed by an array of a plurality of distinct dots having a first frequency arrayed along preselected directions and said halftone image areas are reproduce with a halftone dot pattern having a second frequency and wherein said first frequency is higher than said second frequency.

2. The imaged screened film intermediate according to claim 1 wherein said second frequency is at least three times higher than the first frequency.

3. The imaged screened film intermediate according to claim 1 wherein said preselected directions form an acute angle with an array of a plurality of cells on an metering roll when the flexographic printing plate prepared using said intermediate screened film is mounted on a printing cylinder and inked by said metering roll.

4. The imaged screen film intermediate according to claim 3 wherein said second frequency is at least three times higher than the first frequency.

5. The imaged screened film intermediate according to claim 1 wherein said ink cell dots have a size such that an ink cell formed on a printing plate for use with an ink metering roll using said film screened intermediate has a predetermined ink holding volume.

6. The imaged screened film intermediate wherein said predetermined volume is equal to or less than an amount of ink available to said ink cell through said ink metering roll.

7. A method for producing a screened film intermediate for use in making a printing plate, the method comprising:

supplying imaging information to an imagesetter adapted to expose a film comprising photosensitive material said imaging information comprising at least one solid image area and at least one halftone image area, said halftone image area comprising a halftone dot pattern arrayed at a first frequency and wherein said imaging information supplied to said imagesetter for producing said at least one solid image area further comprises reproducing superposed on said at least one solid image area a dot pattern formed by an array of a plurality of distinct dots arrayed at a second frequency said second frequency being greater than said first frequency.

8. The method according to claim 7 wherein said printing plate is a flexographic printing plate and said dots in said at least one solid area are arrayed along a preselected direction, and wherein said preselected direction forms an acute angle with an array of a plurality of cells on an metering roll when the flexographic printing plate made using said intermediate screened film is mounted on a printing cylinder and inked by said metering roll.

9. A machine readable program for use in a computer to control an imagesetter to produce a screened film for use in making a flexographic printing plate, said program performing the steps of:

(a) storing information representing an image including at least one solid image area and at least one halftone image area comprising halftone dots arrayed at a halftone dot frequency;

(b) determining an ink cell dot size such that an ink cell formed on a printing plate using said film screened intermediate has a predetermined ink holding volume;

(c) determining an ink cell dot pattern using said ink cell size and having a frequency greater that the halftone dot frequency of said at least one halftone dot area; and (d) supplying imaging information for said at least one solid image area and said at least one halftone area to an imagesetter adapted to expose a photosensitive material, said imaging information comprising said solid image area with said ink cell dot pattern superposed thereon and said halftone dots.

10. The program according to claim 9 wherein said predetermined ink holding volume is equal to or less than the amount of ink available to said ink cell through a desired inking roll.

11. The program according to claim 7 further comprising following step (c) the steps of:

(c1) obtaining an orientation of a an array of ink carrying cells on an ink metering roll;

(c2) computing the position of the solid image area when a flexographic printing plate made using the screened film intermediate is placed in a position for applying ink thereon through the metering roll; and wherein step (e) further comprises, supplying said imaging information to superpose said ink cell dot pattern on said solid image areas on the screened film intermediate so that when said intermediate film is used with said plate and said plate is mounted on a printing roll together with said metering roll, the ink cell pattern on said solid image area of said plate is oriented at an acute angle relative to the orientation of said array of ink carrying cells on said metering roll.

* * * * *